United States Patent [19]
Venkatraman et al.

[11] Patent Number: 6,093,966
[45] Date of Patent: Jul. 25, 2000

[54] SEMICONDUCTOR DEVICE WITH A COPPER BARRIER LAYER AND FORMATION THEREOF

[75] Inventors: Ramnath Venkatraman; John Mendonca, both of Austin; Gregory N. Hamilton, Pflugerville; Jeffrey T. Wetzel, Austin, all of Tex.; Tze W. Poon, Sunnyvale, Calif.; Sam S. Garcia, Austin, Tex.

[73] Assignee: Motorola, Inc., Schaumburg, Ill.

[21] Appl. No.: 09/044,852

[22] Filed: Mar. 20, 1998

[51] Int. Cl.[7] ................................................. H01L 29/72
[52] U.S. Cl. ................ 257/751; 257/740; 257/741; 257/750; 257/757; 257/762; 257/768; 438/595; 438/627; 438/643; 438/653; 438/682; 438/687
[58] Field of Search ................................. 257/740, 741, 257/750, 751, 757, 762, 768; 438/595, 627, 630, 643, 649, 653, 682, 687

[56] References Cited

U.S. PATENT DOCUMENTS

| | | | |
|---|---|---|---|
| 5,178,739 | 1/1993 | Barnes et al. | 204/192.12 |
| 5,431,016 | 7/1995 | Simpkin | 60/650 |
| 5,431,799 | 7/1995 | Mosely et al. | 204/298.06 |
| 5,449,955 | 9/1995 | Debiec et al. | 257/762 |
| 5,614,437 | 3/1997 | Choudhury | 437/140 |

OTHER PUBLICATIONS

"Metal Ion Deposition From Ionized Mangetron Sputtering Discharge," Rossnagel, et al.; J. Vac. Sci. Technol. B 12(1), Jan./Feb. 1994; pp. 449–453.

"Filling Dual Damascene Interconnect Structures With AlCu and Cu Using Ionized Magnetron Deposition," Rossnagel; J. Vac. Sci. Technol. B 13(1), Jan./Feb. 1995; pp. 125–129.

"Simulations of Trench–Filling Profiles Under Ionized Magnetron Sputter Metal Deposition," Hamaguchi, et al., Mar. 20, 1998.

*Primary Examiner*—Edward Wojciechowicz

[57] ABSTRACT

A method of forming a semiconductor device by first providing a substrate in a processing chamber. The substrate has an insulating layer and an opening in the insulating layer. A copper barrier layer is formed on the insulating layer and in the opening by providing a plurality of refractory metal atoms and a plurality of silicon atoms in the processing chamber. The atoms are ionized by applying a first bias to the atoms to form a plasma. The substrate is then biased by a first stage bias followed by a second stage bias to accelerate the plasma to the substrate to form the copper barrier layer, where the first stage bias is less than the second stage bias. The copper-containing metal is then deposited on the copper barrier layer over the insulating layer and in the opening. The present invention further includes a semiconductor device formed by the above method.

31 Claims, 4 Drawing Sheets

SEMICONDUCTOR DEVICE WITH A COPPER BARRIER LAYER AND FORMATION THEREOF

FIELD OF THE INVENTION

The present invention relates generally to semiconductor devices, and more particularly, to a semiconductor device having a copper barrier layer and a method of forming that device.

BACKGROUND OF THE INVENTION

The semiconductor industry has moved to using copper for various aspects of forming a semiconductor device due to certain advantages of copper over other metals. Copper has a first advantage of having a lower resistivity over, for example aluminum, which contributes to lower resistance-capacitance delays which allows a device to operate at faster speeds. Copper further has a higher electromigration resistance which permits smaller scaling of semiconductor devices. However, as the semiconductor industry moves towards copper, certain problems particular to copper arise. One such problem is that copper has a high diffusivity through dielectric and silicon materials on which the copper is deposited which may cause poisoning of the materials and semiconductor device failure.

To correct the diffusivity issue, a barrier material must typically be deposited between the copper layer and the dielectric material to prevent the copper from diffusing into the dielectric or silicon material. Typically, titanium nitride has been used as a barrier material for metals such as aluminum, but titanium nitride has not been as effective for copper. Instead, tantalum based barrier materials have been used with copper. However, tantalum has further problems in that tantalum, and even tantalum nitride, is not amorphous and therefore has porous boundaries which create a diffusion path. Tantalum silicon nitride (TaSiN) is a superior barrier material for copper in semiconductor devices due to its amorphous nature and consequently superior barrier properties towards preventing copper diffusion.

However, the deposition of TaSiN as a barrier material poses other problems. TaSiN is typically deposited using physical vapor deposition (PVD), rather than chemical vapor deposition (CVD), since CVD of TaSiN is more expensive and, due to the non-availability of suitable precursors, presents practical difficulties in its implementation. In PVD, a target material containing tantalum silicon is sputtered using reactive ion sputtering (RIS) in a nitrogen containing plasma to form the TaSiN film. This technique, however, causes enrichment of silicon in undesirable locations of the barrier material. Specifically, as shown in prior art FIG. 1, using PVD with TaSiN causes enrichment of silicon (represented as silicon 12) at the trench bottom 15 of the trench 10 due to differences in sticking coefficients of the tantalum rich and silicon rich species that have been sputtered off a target and also due to preferential re-sputtering of silicon from the surface of the film deposited onto the substrate 21. The resputtering effect is weakest within the etched geometries. Both these effects contribute to the enrichment of silicon at the trench bottom 15. With silicon enrichment occurring at the trench bottom 15, the contact resistance at the interface 20 between the trench and the substrate 21 may become unacceptably high causing device failure. A need therefore exists for a method of forming the barrier material, that is TaSiN, into a trench to have a uniform thickness and no silicon enrichment at the bottom of the trench that may cause device failure.

Related to this need for forming a barrier material to avoid silicon enrichment and create a uniform thickness is the need to ensure that such a barrier material may be used with lower dielectric constant (low K) materials. For example, from prior art FIG. 1, there are advantages to using a dielectric material 22 having a low K. Low K materials are increasingly being used as dielectric material between metallic interconnects and integrated circuits due to advantages realized in minimizing RC delay. When used in conjunction with copper metallization, the above benefits are maximized due to the low electrical resistivity of copper when compared with aluminum based metallizations. However, a problem exists with using the low K material in typical PVD processes in that the adhesion of barrier materials to low K dielectrics is poor due to the combination of high intrinsic stress of barrier materials and damage to the low K material during the deposition which lowers its cohesive strength. CVD barrier materials are typically deposited at higher temperatures which render the low K material unstable. As such, a need exists for combining both copper and low K materials in a semiconductor device without overheating or damaging the low K material.

A technique exists for depositing a film using inductively coupled plasma (ICP) PVD that involves the use of an apparatus as shown in prior art FIG. 2. The general technique is described in U.S. Pat. No. 5,178,739 assigned to International Business Machines and incorporated herein by reference. In ICP PVD, a target 25 and a substrate 30 are within a vacuum chamber 35. Using a sputtering source such as a magnetron source (not shown) outside of the chamber behind target 25, atoms are sputtered off the target. Radio Frequency (RF) power 50 is inductively coupled to RF coils 55 into the chamber to maintain the plasma region 45 which serves to ionize the sputtered tantalum and silicon rich species. The substrate 30 is attached to a bias RF power 60 to control ion direction and energy. In operation, the RF power 50 is applied through the coils 55 to ionize the sputtered atoms in the plasma region 45. The bias RF power 60 is coupled to the substrate 30 to develop a negative bias so that the ionized atoms are accelerated into features etched in the substrate 30 to form a film of a barrier material. Deposition is done at a relatively high chamber pressure compared to a standard PVD technique.

The Applicants have recognized a need to develop a copper barrier layer using TaSiN and the ICP PVD technique to avoid the problems discussed above. Specifically, the need exists for a method of forming a semiconductor device with a copper barrier layer having a uniform thickness, avoiding silicon enrichment at the bottom of trenches and that is compatible with low K dielectrics.

BRIEF DESCRIPTION OF THE DRAWINGS

A better understanding of the present invention can be obtained when the following detailed description of a preferred embodiment is considered in conjunction with the following drawings, in which.

Figure 1:
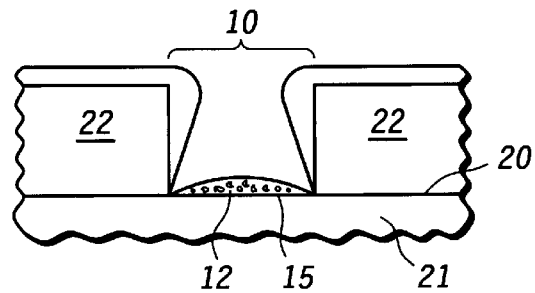
FIG. 1 is a prior art cross-sectional view depicting a semiconductor device with enrichment of silicon in undesirable locations of a barrier material.

It will be appreciated that for simplicity and clarity of illustration, elements illustrated in the drawings have not necessarily been drawn to scale. For example, the dimensions of some of the elements are exaggerated relative to other elements for purposes of clarity. Further, where considered appropriate, reference numerals have been repeated among the drawings to indicate corresponding or analogous elements.

DETAILED DESCRIPTION OF A PREFERRED EMBODIMENT

In the following detailed description, various embodiments of the method of forming a copper barrier layer will be detailed. It is understood, however, that the present invention is directed to a method of forming a semiconductor device by first providing a substrate in a processing chamber. The substrate has an insulating layer and an opening in the insulating layer on which the copper barrier layer will be formed. The copper barrier layer is formed by the process of providing a plurality of refractory metal atoms and a plurality of silicon atoms in the processing chamber. Then, the plurality of refractory metal atoms and the plurality of silicon atoms are ionized by applying a first bias to the atoms to form a plasma. The substrate is then biased by a first stage bias followed by a second stage bias to accelerate the plasma to the substrate to form the copper barrier layer, where the first stage bias is less than the second stage bias. A copper-containing metal is then deposited on the copper barrier layer over the insulating area and in the opening. The present invention further covers a semiconductor device formed by the above method.

It is noted that throughout this detailed description, certain layers of materials will be deposited and removed to form the semiconductor device of the present invention. Where the specific procedures for depositing such layers or thicknesses of such layers are not detailed below, conventional techniques to one skilled in the art for depositing such layers at appropriate thicknesses shall be intended. Such details are well-known and not considered necessary to teach one skilled in the art of how to make or use the present invention. The semiconductor device and method of forming the semiconductor device will now be described in detail with reference to FIGS. 3–10.

Figure 3:
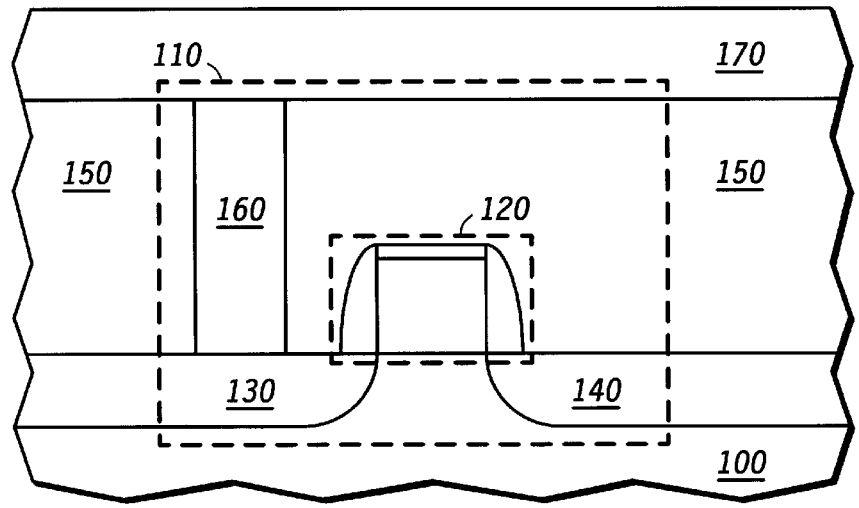
FIG. 3 is a cross-sectional view of the active area and first metal layer of a semiconductor device of the present invention.

FIG. 3 is a cross-sectional view of an active device and first metal layer of a semiconductor device of the present invention. In FIG. 3, a substrate 100, typically silicon, has an active device 110 on the substrate 100. The active device 110 has a gate region 120 on the substrate 100 and a source region 130 and a drain region 140 in the substrate 100. The formation of the active device 110 is performed using conventional techniques known to one skilled in the art. A first insulating layer 150 is formed over the gate region 120 and down to the substrate 100 over the source region 130 and drain region 140. The first insulating layer is typically silicon dioxide, however combinations of silicon dioxide and other doped dielectrics (e.g. BPSG, PSG) are also commonly used. A first opening 160 has been formed in the first insulating layer 150 and is filled with a metal-containing material such as tungsten, however copper and aluminum may also be used. A first metal layer 170 is deposited over the first insulating layer 150 and the first opening 160. The first metal layer 170 is typically copper, but may also be aluminum or tungsten. The first opening 160 is shown as a via in FIG. 3, however, other openings such as a trench may also be used. After the first metal layer 170 has been formed, the structure at FIG. 3 is prepared to undergo the formation of a copper barrier layer of the present invention. It should be noted that the first metal layer 170 may also be considered a substrate, such as substrate 100, in the method of forming a copper barrier layer of the present invention as claimed below.

Figure 4:
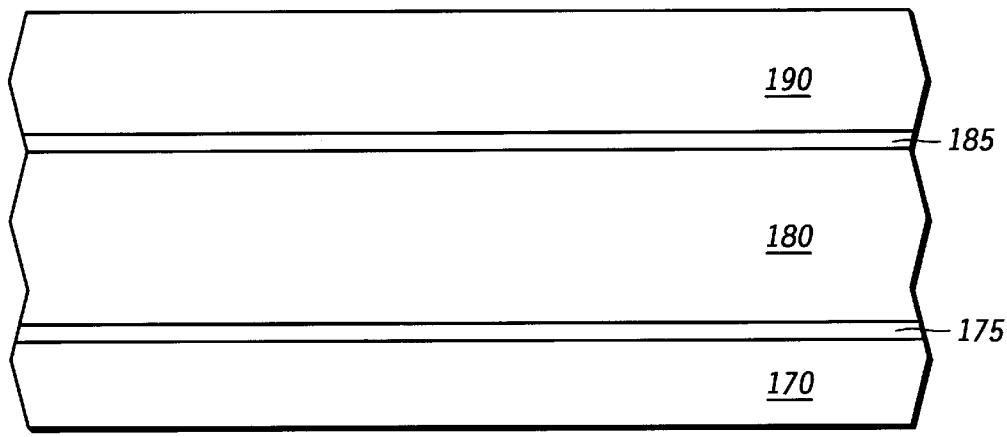
FIG. 4 is a cross-sectional view of an embodiment of the semiconductor device of the present invention exploded from the top portion of FIG. 3 after performing certain steps of the method of forming such device.

FIG. 4 is a cross-sectional view of an embodiment of the semiconductor device of the present invention exploded from the top portion of FIG. 3 after performing certain steps of the method of forming such device. In FIG. 4, the substrate 170 of FIG. 3 and the layers formed thereon are processed in a conventional processing chamber (not shown) for depositing such layers. A first dielectric layer 175 is deposited on the first metal layer 170. The first dielectric layer 175 is typically either a single layer or a combination of silicon nitride or silicon oxynitride and is used for purposes of acting as an interlevel diffusion barrier for copper as well as an anti-reflective film for lithography purposes. The first dielectric layer is typically less than about 1000 angstroms. On the first dielectric layer 175 is deposited an insulating layer 180 which is typically a silicon dioxide layer, but may also be a low K dielectric material. Low K materials include spin-on and CVD polymeric materials based on silicon or carbon, or based on combinations of silicon and carbon. Examples of spin-on Low-K materials include: organic thermoplastic and thermosetting polymers such as polyimides, polyarylethers, benzocyclobutenes, polyphenylquinoxalines, polyquinolines; inorganic and spin-on glass materials such as silsesquioxanes, silicates, and siloxanes; mixtures, or blends, of organic polymers and spin-on glasses. Examples of CVD low K materials include polymers of parylene and napthalene, copolymers of parylene with polysiloxanes or teflon, and polymers of polysiloxane. The insulating layer 180 is typically less than about 20,000 angstroms. Next, an anti-reflection coating (ARC) layer 185 is deposited on the insulating layer 180 to minimize reflections from underlying features during the subsequent photolithographic definition of features such as vias and trenches, so that a uniform distribution of critical dimensions of these features is obtained. The ARC layer 185 is typically about 1,000 angstroms in thickness. On the ARC layer 185 is deposited a second oxide layer 190 with a thickness of less than about 15,000 angstroms.

Figure 5:
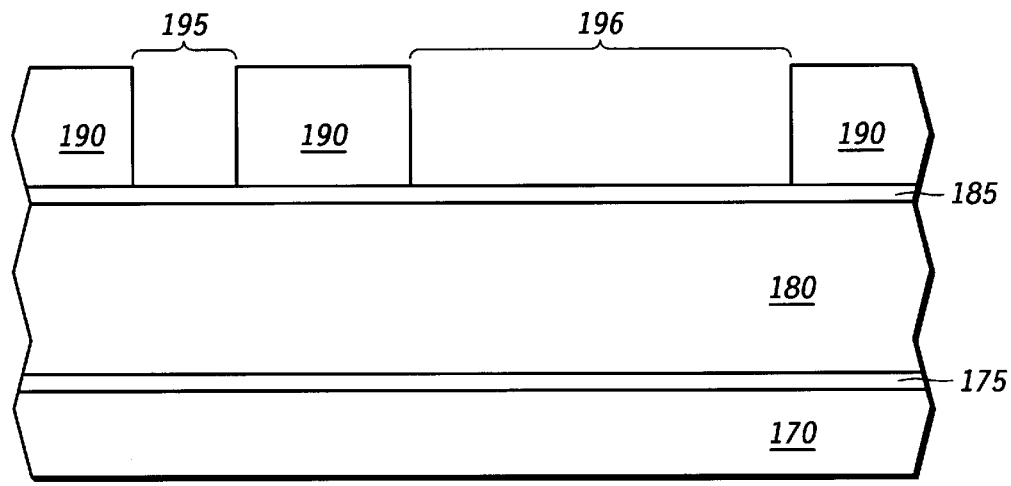
FIG. 5 is a cross-sectional view of an embodiment of the semiconductor device of the present invention after performing further step(s) of the method of forming such device.
Figure 6:
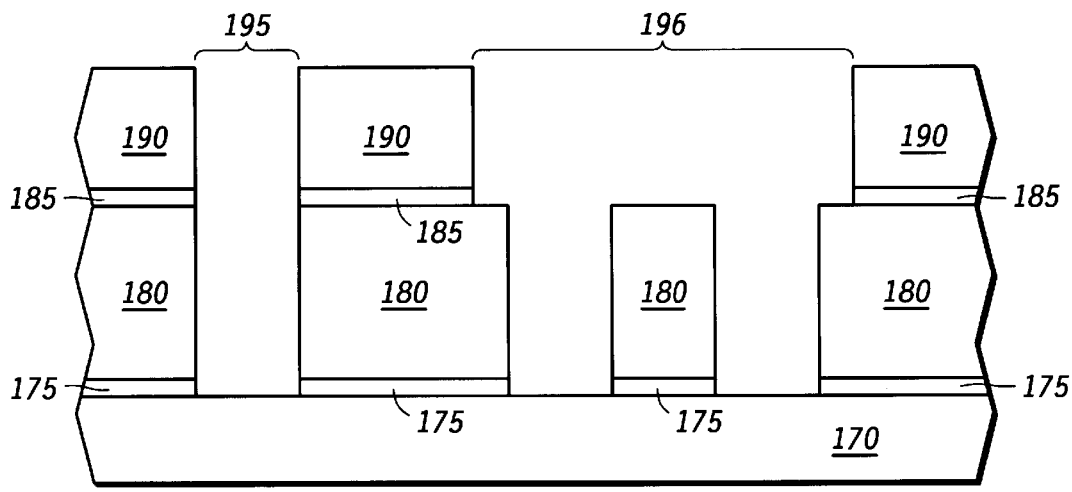
FIG. 6 is a cross-sectional view of an embodiment of the semiconductor device of the present invention after performing further step(s) of the method of forming such device.

FIG. 5 is a cross-sectional view of an embodiment of the semiconductor device of the present invention after performing further step(s) in the method of forming such device. In FIG. 5, openings 195 and 196 have been patterned into the second oxide layer 190 down to the ARC layer 185 using conventional patterning techniques. Then in FIG. 6, which is a cross-sectional view of an embodiment of the semiconductor device of the present invention after still further step(s) in the method of forming such device, the insulating layer 180, the ARC layer 185 and the first dielectric layer 175 in the openings 195, 196 have been patterned to extend the openings 195 and 196 down to the first metal layer 170. It is noted that the opening 196 forms a trench while the opening 195 forms a via. It is understood that the openings of the present invention may therefore refer to either a trench or a via, or a combination of a trench overlying a via as shown in FIG. 6. It is further noted that while the present embodiment includes both an insulating layer 180 and a second oxide layer 190, a further embodiment of the present invention may use the copper barrier layer of the present invention with only one of such insulating layers.

Figure 2:
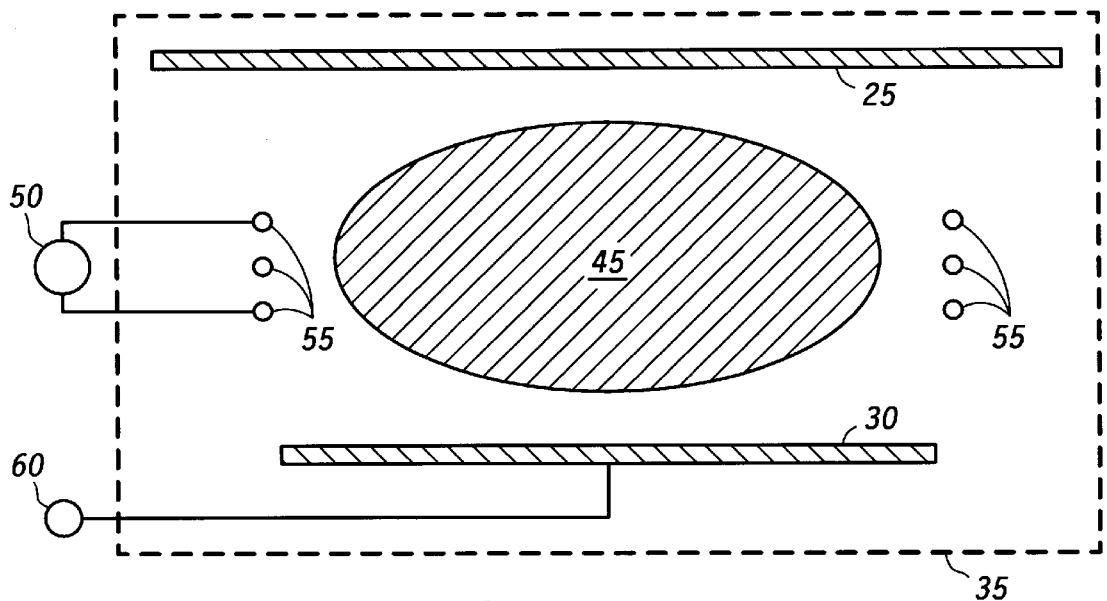
FIG. 2 is a prior art schematic view of the ICP PVD technique.
Figure 7:
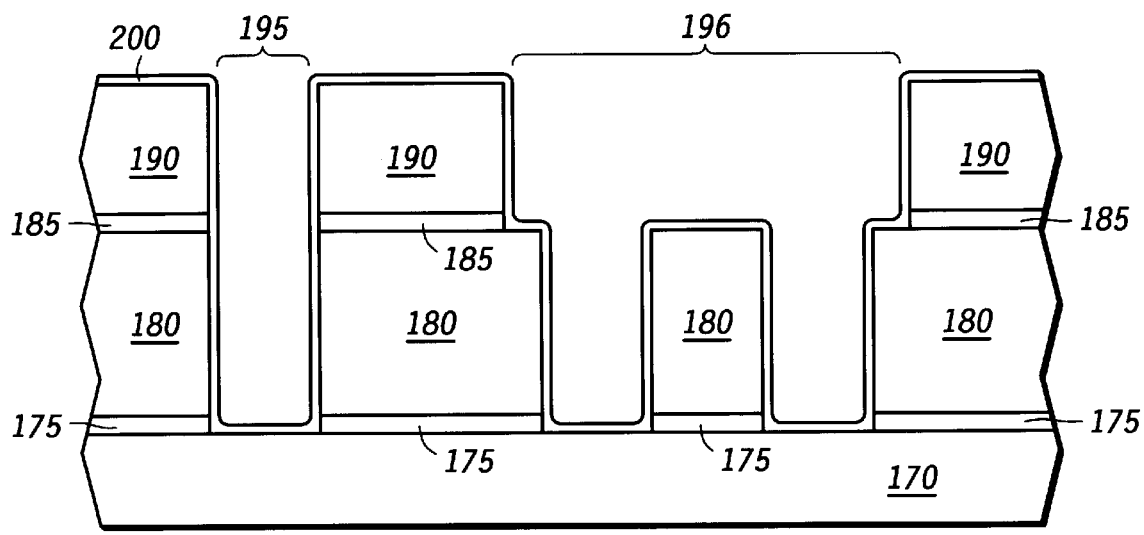
FIG. 7 is a cross-sectional view of an embodiment of the semiconductor device of the present invention after performing further step(s) of the method of forming such device.

FIG. 7 is a cross-sectional view of an embodiment of the semiconductor device of the present invention after performing even further step(s) in the method of forming such device. In FIG. 7, a copper barrier layer 200 is deposited on the second oxide layer 190 and the insulating layer 180 and along the sidewalls of the opening 195 and 196. The copper barrier layer 200 is typically a tantalum silicon nitride layer, but may also be composed of any combination of refractory metal such as molybdenum, tungsten, titanium, vanadium together with silicon and nitrogen (e.g. a nitrogen-containing tantalum). The copper barrier layer 200 is formed on the device of FIG. 6 by an ICP PVD process, e.g. using the apparatus shown in prior art FIG. 2, by first providing a plurality of refractory metal atoms and a plurality of silicon atoms in the processing chamber such as the chamber of FIG. 2. Then the atoms are ionized in the chamber, such as the vacuum chamber 35 of prior art FIG. 2, by applying a first bias (e.g. by coupling an RF source to the refractory metal and silicon atoms which have been sputtered off the target) to form a plasma containing the atoms, silicon and nitrogen. The refractory metal can be a material selected from the group of tantalum, titanium, vanadium, molybdenum, or tungsten. This ionizing step would be processed in an ICP apparatus such as that of prior art FIG. 2. The RF power 50 is applied through coils 55 in prior art FIG. 2. After the atoms are ionized in the processing chamber, the substrate 170, or even the substrate 100 of FIG. 3, is biased with respect to the plasma by application of a two-staged RF power bias to accelerate the ionized refractory metal and silicon atoms to the substrate 170 to form the copper barrier layer 200. As such, the bias may be adjusted in two stages. During a first stage bias of deposition, which forms the copper barrier layer 200, the first stage bias can be kept close to zero, so that no acceleration of ions into the substrate is obtained at this stage. During a second stage bias, which forms the copper barrier layer 201 of FIG. 8, the bias can be turned on. The first stage bias is typically less than the second stage bias.

In operation, the high bias (i.e. the second stage bias) has the effect of reducing the silicon concentration on the horizontal features and maintaining a relatively higher silicon concentration along the sidewalls of the features. The horizontal surfaces contain the bottom silicon concentration of trenches, vias as well as the field regions on the substrates where there are no etched features. The vertical surfaces contain the sidewall silicon concentration of the trenches and vias. The reduction in silicon content at the bottom of the features is required to minimize the electrical contact resistance whereas along the sidewalls, a relatively higher silicon content is required to retain the amorphous nature of the barrier material thus affording it excellent barrier properties. The two-step bias process also offers the advantage of minimizing damage to the low K material that could be caused by the high energy of the atoms that are being accelerated by the bias applied to the substrate. Since the first step of the barrier deposition is done without the substrate bias, this damage is avoided.

Figure 8:
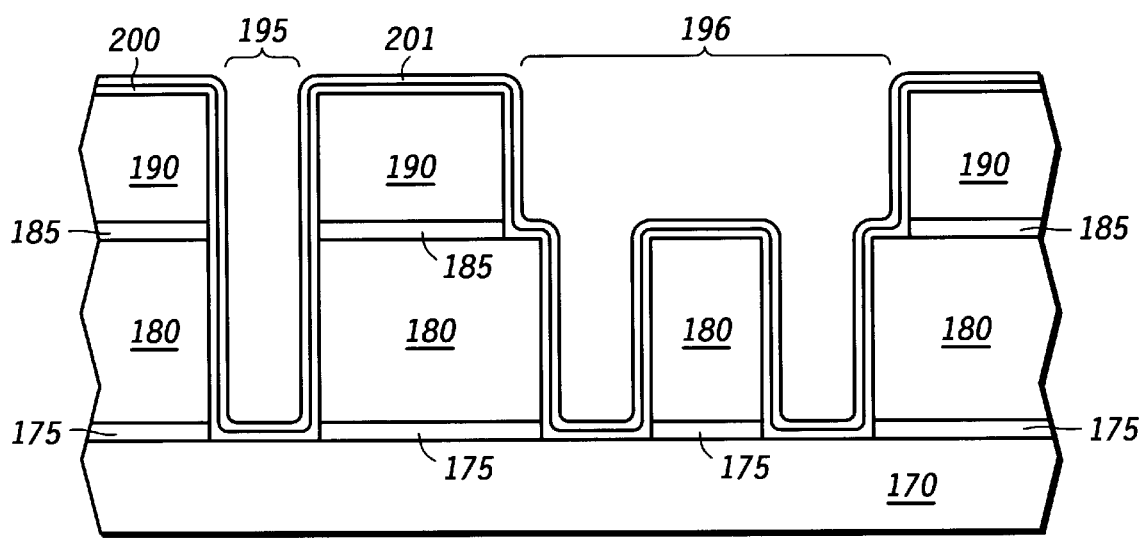
FIG. 8 is a cross-sectional view of an embodiment of the semiconductor device of the present invention after performing further step(s) of the method of forming such device.

FIG. 8 is a cross-sectional view of an embodiment of the semiconductor device of the present invention after performing further step(s) of the method of forming such device. In FIG. 8, copper barrier layer 201 is deposited on the copper barrier layer 200 by performing the second stage bias described above. The deposition of the copper barrier layer 200, 201 using the first stage bias for layer 200 and the second stage bias for layer 201 causes the silicon enrichment at the bottom of the openings 195, 196 to be removed in both layers 200, 201. Both layers 200, 201 are considered a copper barrer layer in this embodiment of the present invention.

Figure 9:
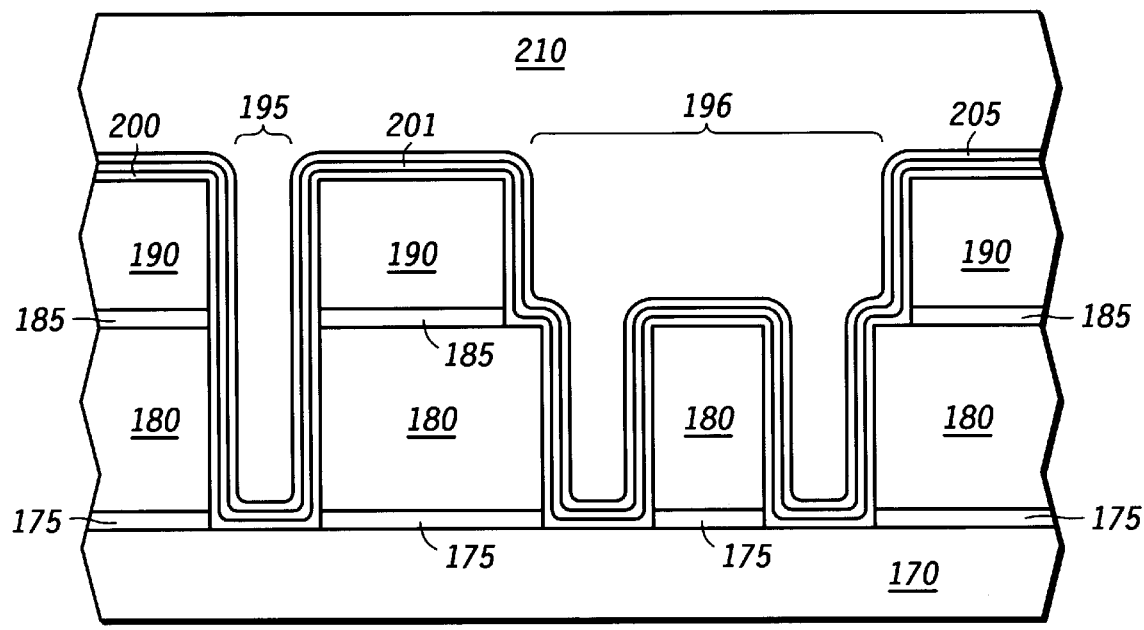
FIG. 9 is a cross-sectional view of an embodiment of the semiconductor device of the present invention after performing further step(s) of the method of forming such device.
Figure 10:
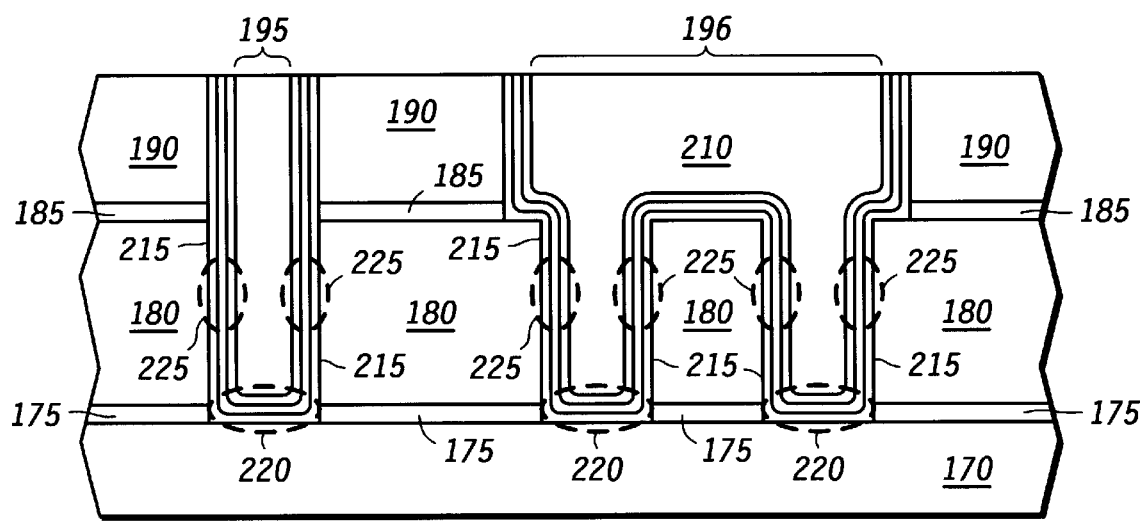
FIG. 10 is a cross-sectional view of an embodiment of the semiconductor device of the present invention.

FIG. 9 is a cross-sectional view of an embodiment of the semiconductor device of the present invention after performing further step(s) of the method of forming such device. In FIG. 9, a copper seed layer 205 has been deposited on the copper barrier layer 200, 201 using ICP of copper. A copper-containing metal 210 is then deposited on the copper seed 205 and in the openings 195 and 196 to fill the vias and trenches. In FIG. 10, the structure of FIG. 9 has been polished to remove and planarize a predetermined amount of the copper-containing metal 210, e.g. down to the second oxide layer 190, to form the semiconductor device of the present invention. The polishing step is performed using either chemical mechanical polishing or etch back techniques. The semiconductor device formed avoids the problems associated with the prior art in that the copper barrier layer 200, 201 has a uniform thickness and does not have silicon enrichment at the bottom of the via 195 or trench 196 that interfaces with the substrate 170. Further, the insulating layer 180 may be a low K dielectric since the ICP PVD is performed at a temperature less than 350° C. that does not damage the low K dielectric being used. As such, the advantages described herein of using such a low K dielectric may be utilized. Thus, in FIG. 10, which is a cross-sectional view of an embodiment of the semiconductor device of the present invention, the sidewalls 215 of the openings 195 and 196 have a sidewall silicon concentration that is less than the silicon concentration at the bottom of such openings. Accordingly, the bottom silicon concentration 220, which is less than 5%, is less than the sidewall silicon concentration 225 which is typically in the range of 10–20%.

It is understood that additional embodiments may be formed to fall within the scope of the present invention as claimed below.

We claim:

1. A method of forming a semiconductor device, comprising the steps of:

providing a substrate in a processing chamber, the substrate having an insulating layer and an opening in the insulating layer;

forming a copper barrier layer on the insulating layer and in the opening, the forming step comprising the substeps of:

providing a plurality of refractory metal atoms and a plurality of silicon atoms in the processing chamber;

ionizing the plurality of refractory metal atoms and the plurality of silicon atoms by applying a first bias to the plurality of refractory metal atoms and the plurality of silicon atoms to form a plasma;

biasing the substrate at a first stage bias followed by a second stage bias to accelerate the plasma to the substrate to form the copper barrier layer, wherein the first stage bias is less than the second stage bias; and depositing a copper-containing metal on the copper barrier layer over the insulating layer and in the opening.

2. The method of claim 1, wherein the opening is a via.

3. The method of claim 1, wherein the opening is a trench.

4. The method of claim 1, wherein the opening is a combination of a trench overlying a via.

5. The method of claim 1, wherein the insulating layer is a low K dielectric.

6. The method of claim 1, wherein the first stage bias is at or near a zero bias.

7. The method of claim 1, wherein the copper barrier layer is nitrogen-containing tantalum.

8. The method of claim 1, wherein the copper barrier layer is a refractory metal combined with silicon and nitrogen.

9. The method of claim 8, wherein the refractory metal is a material selected from the group consisting of tantalum, titanium, vanadium, molybdenum and tungsten.

10. The method of claim 1, further comprising the step of polishing the copper-containing metal to remove a predetermined amount of the copper-containing metal.

11. The method of claim 1, wherein the substrate is a metal-containing layer.

12. The method of claim 1, wherein the step of applying the first bias further comprises the steps of:

providing a target in the processing chamber; and coupling a radio frequency power to the plurality of refractory metal atoms and the plurality of silicon atoms located between the substrate and the target in the processing chamber.

13. A method of forming a semiconductor device comprising the steps of:

providing a substrate in a processing chamber;

forming an active device on the substrate, the active device having a gate region on the substrate, the gate region being between a source region in the substrate and a drain region in the substrate;

forming a first insulating layer over the active device;

forming a first opening in the first insulating layer, the first opening having a metal-containing material;

forming a first metal layer over the first insulating layer;

depositing a second insulating layer over the first metal layer;

forming a second opening in the second insulating layer;

forming a copper barrier layer on the second insulating layer and in the second opening, the forming step comprising the substeps of:

providing a plurality of refractory metal atoms and a plurality of silicon atoms in the processing chamber;

ionizing the plurality of refractory metal atoms and the plurality of silicon atoms by applying a first bias to the plurality of refractory metal atoms and the plurality of silicon atoms to form a plasma; and biasing the substrate at a first stage bias followed by a second stage bias to accelerate the plasma to the substrate to form the copper barrier layer, wherein the first stage bias is less than the second stage bias;

depositing a copper-containing metal on the copper barrier layer over the second insulating layer and in the second opening; and polishing the copper-containing metal to remove a predetermined amount of the copper-containing metal.

14. The method of claim 13, wherein the second insulating layer is a low K dielectric.

15. The method of claim 13, wherein the copper barrier layer is a refractory metal combined with silicon and nitrogen.

16. The method of claim 15, wherein the refractory metal is a material selected from the group consisting of tantalum, titanium, vanadium, molybdenum and tungsten.

17. The method of claim 13, wherein the copper barrier layer is nitrogen-containing tantalum.

18. The method of claim 13, wherein the second opening is a via.

19. The method of claim 13, wherein the second opening is a trench.

20. The method of claim 13, wherein the opening is a combination of a trench overlying a via.

21. The method of claim 13, wherein the first stage bias is at or near a zero bias.

22. A semiconductor device, comprising:

a substrate;

an insulating layer on the substrate, the insulating layer having an opening, the opening having an opening bottom and opening sidewalls;

a copper barrier layer on the insulating layer and in the opening, the copper barrier layer having a sidewall silicon concentration and a bottom silicon concentration, wherein the bottom silicon concentration is less than the sidewall silicon concentration; and a copper-containing layer over the insulating layer and in the opening.

23. The semiconductor device of claim 22, wherein the insulating layer is a low K dielectric.

24. The semiconductor device of claim 22, wherein the opening is a combination of a trench overlying a via.

25. The semiconductor device of claim 22, wherein the copper barrier layer is a refractory metal combined with nitrogen and silicon.

26. The semiconductor device of claim 25, wherein the refractory metal is a material selected from the group consisting of tantalum, titanium, vanadium, molybdenum and tungsten.

27. The semiconductor device of claim 22, wherein the copper barrier layer is nitrogen-containing tantalum.

28. The semiconductor device of claim 22, wherein the opening is a via.

29. The semiconductor device of claim 22, wherein the opening is a trench.

30. The semiconductor device of claim 22, wherein the bottom silicon concentration is less than 5% silicon.

31. The semiconductor device of claim 22, wherein the sidewall silicon concentration is in a range of about 10 to 20% silicon.

* * * * *